United States Patent
Foord (10) Patent No.: US 9,514,913 B2
(45) Date of Patent: Dec. 6, 2016

(54) TEM SAMPLE MOUNTING GEOMETRY

(71) Applicant: FEI Company, Hillsboro, OR (US)

(72) Inventor: David Foord, Portland, OR (US)

(73) Assignee: FEI COMPANY, Hillsboro, OR (US)

(*) Notice: Subject to any disclaimer, the term of this patent is extended or adjusted under 35 U.S.C. 154(b) by 0 days.

(21) Appl. No.: 14/802,119

(22) Filed: Jul. 17, 2015

(65) Prior Publication Data

US 2016/0020065 A1 Jan. 21, 2016

Related U.S. Application Data (60) Provisional application No. 62/027,035, filed on Jul. 21, 2014.

(51) Int. Cl.
*H01J 37/00* (2006.01)
*H01J 37/22* (2006.01)
*H01J 37/26* (2006.01)
*H01J 37/20* (2006.01)
*H01J 37/244* (2006.01)

(52) U.S. Cl.
CPC ............. *H01J 37/22* (2013.01); *H01J 37/20* (2013.01); *H01J 37/244* (2013.01); *H01J 37/26* (2013.01); *H01J 2237/20207* (2013.01); *H01J 2237/20214* (2013.01); *H01J 2237/226* (2013.01)

(58) Field of Classification Search
CPC ............. H01J 37/22; H01J 37/26; H01J 2237/20214; H01J 37/20; H01J 2237/20207; H01J 2237/226; H01J 37/244
USPC ............. 250/306, 307, 310, 311, 440.11
See application file for complete search history.

(56) References Cited

U.S. PATENT DOCUMENTS

| | | |
|---|---|---|
| 4,876,112 A | 10/1989 | Kaito et al. |
| 5,104,684 A | 4/1992 | Tao et al. |
| 5,563,412 A | 10/1996 | Zandbergen et al. |
| 7,442,924 B2 | 10/2008 | Giannuzzi et al. |
| 7,851,769 B2 | 12/2010 | Schmid et al. |
| 7,884,326 B2 | 2/2011 | Van De Water et al. |
| 7,939,906 B2 | 5/2011 | Luo et al. |
| 7,977,631 B2 | 7/2011 | Mulders et al. |
| 2006/0011868 A1 | 1/2006 | Kidron et al. |
| 2007/0187597 A1 | 8/2007 | Suzuki et al. |
| 2008/0067374 A1* | 3/2008 | Ono ............. G01R 31/307 250/310 |
| 2009/0127474 A1* | 5/2009 | Tsuneta ............. H01J 37/20 250/442.11 |
| 2013/0344292 A1 | 12/2013 | Bugge et al. |

FOREIGN PATENT DOCUMENTS

JP 2009192341 8/2009

* cited by examiner

*Primary Examiner* — Michael Maskell
(74) *Attorney, Agent, or Firm* — Scheinberg & Associates, P.C.; Michael O. Scheinberg; John E. Hillert (57) ABSTRACT

A system and method for transmission electron microscopy is provided. The sample can be examined from multiple directions using an electron beam in a transmission electron microscope. The sample has at least three observation faces that are not parallel to each other with the thickness of the sample orthogonal to each of the observation faces being less than 200 nm. The sample is mounted on a needle that is needle rotatable about more than one axis so the needle can orient at least three of the observation faces to be normal to the electron beam of the electron microscope for observation.

22 Claims, 8 Drawing Sheets

TEM SAMPLE MOUNTING GEOMETRY

This Application claims priority from U.S. Prov. App. 62/027,035 filed Jul. 21, 2014, which is hereby incorporated by reference.

TECHNICAL FIELD OF THE INVENTION

The present invention relates to methods for r transmission electron microscope analysis, and obtaining orthogonal images of mounted samples.

BACKGROUND OF THE INVENTION

The density of integrated circuits (ICs) continues to dramatically increase due to the decrease in both the size of circuit features and components (e.g., transistors) and the pitch or distance between them. In order to develop reliable IC manufacturing processes, measure characteristic feature sizes, diagnose manufacturing defects, and perform quality control, integrated circuit manufacturers typically inspect integrated circuits or portions of integrated circuits via transmission or scanning transmission electron microscopes (TEM). As used herein, the term transmission electron microscope is intended to include scanning transmission electron microscope.

Most IC device components are structurally orthogonal, having characteristic lengths, widths, and depths. Typically, images, analytical maps are taken from one of these orthogonal directions and provide the necessary end data. Given the current size of such components, transmission electron microscopy is often the only effective way to visualize, inspect and measure the features and components of IC devices. Currently, such measurements are made from the inspection of thin cross-sectional slices or lamellae that are extracted from the ICs. Extracted lamellae are typically 30-100 nm thick in the viewing direction (i.e., the transmitted electron beam direction) but can be as thin as 10 nm or below for current technology nodes, and have a cross-sectional area between about 4 um$^2$ and 16 um$^2$. Various problems can occur when trying to extract thin lamellae from processed Si wafers including warping, bending, overmilling, amorphisation and so-called curtaining. These problems can, in turn, lead to poor IC device characterization, such as poor measurement of the characteristic sizes of IC device features or component. Moreover, since IC device features and components are three dimensional, their proper characterization requires inspection in all three dimensions, often requiring separate lamellae to be extracted in three different viewing directions. The separate lamellae in different orientations are extracted from different instances of the same feature, such as different one of identical memory cells.

TEM samples are viewed by transmitting a beam of electrons through the sample and detecting the transmitted electrons on the opposite side to form the image. The beam is typically orthogonal to the face of the lamella. In electron tomography, the sample (or beam) is tilted through a series of tilt angles, with an image formed at each of the different tilt angles, to provide data that can be used to mathematically reconstruct a three dimensional image. Because it is impossible to obtain a complete 180 degree tilt series of a lamella, a pillar-shaped sample is sometimes used for electron tomography. A pillar shaped sample has the disadvantage of having non-uniform thickness across the sample when viewed from any direction.

SUMMARY OF THE INVENTION

An object of the invention is to provide three dimensional imaging of a thin sample.

Some embodiments include a sample and sample holding apparatus for observing a sample in multiple directions using an electron beam in a transmission electron microscope, comprising a sample having at least three observation faces that are not parallel to each other, the thickness of the sample orthogonal to each of the observation faces being less than 200 nm; and a needle to which the sample is mounted, the needle rotatable about more than one axes so the needle can orient at least three of the observation faces to be normal to the electron beam of the electron microscope.

Some embodiments include a method and a sample for connecting a sample having a plurality of orthogonal faces to a rotatable sample holder; rotating the rotatable sample holder to a plurality of angles, such that for each of the plurality of angles a different one of the sample's plurality of orthogonal faces is exposed to and parallel to an electron beam generated by the charged particle beam apparatus; detecting, at each of the plurality of angles, the electrons from the electron beam that are transmitted through each of the sample's plurality of orthogonal faces; and generating a plurality of orthogonal images of the sample from the detected electrons transmitted through the sample at each of the sample's plurality of orthogonal faces.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

One way to overcome the various problems coincident with extracting 3 orthogonal lamellae from an IC device in order to characterize a given feature or component of the device is to instead extract a thick bulk sample from the device containing the desired feature or component, and use a TEM to tomographically reconstruct the thick bulk sample. Complete tomographic imaging, however, requires obtaining multiple image projections from multiple angles, and mathematically combining the information contained in the multiple image projections using time consuming image reconstruction algorithms. Fortunately, IC device manufacturers can often quickly and easily make component measurements or diagnose component defects and sources of component defects by simply viewing TEM images of an extracted bulk sample containing the component from three orthogonal directions. Obtaining three orthogonal TEM images rather than a full tomographically reconstructed image is advantageous since the individual TEM images have higher resolutions than those reconstructed from a TEM tomographic image series and can be obtained much more quickly.

Figure 1:
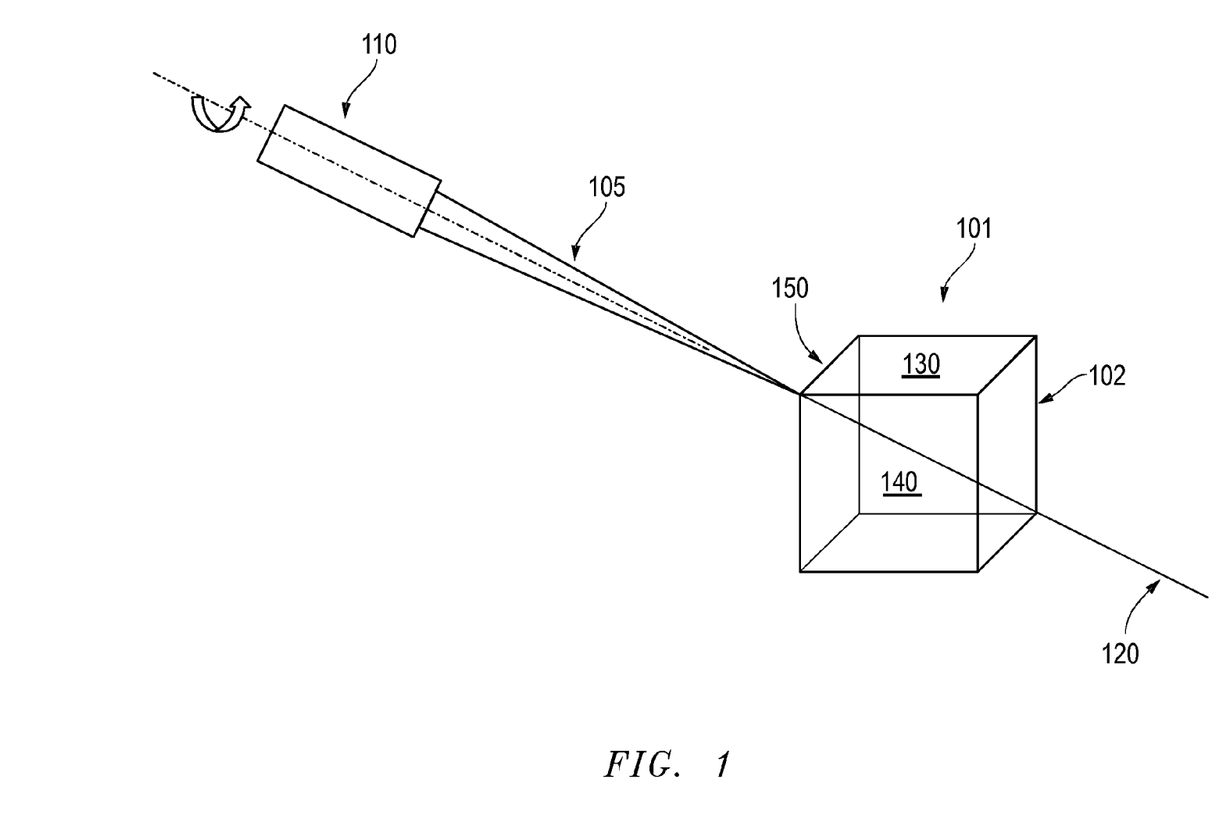
FIG. 1 is an illustration of a method of mounting a bulk sample on a rotatable shaft to enable viewing three orthogonal sides of the sample in a TEM by rotating the shaft.

FIG. 1 is an illustration of a method of mounting a bulk sample on a rotatable shaft to enable viewing 3 orthogonal sides of the sample in a TEM by rotating the shaft. The sample 102 can be made of any material. For example, it can be obtained from an integrated circuit and made from the materials used to make integrated circuits. The sample 102 can be extracted from a larger piece of material using conventional TEM sample preparation techniques. For example, the sample 102 can be extracted in a focused ion beam (FIB) machine or a dual FIB/SEM machine using conventional ion beam milling techniques, such as those used to extract lamellae from larger pieces of material. In general, sample 102 should be dimensioned so that it is partially transparent to the electrons from a TEM electron beam so that a TEM image of the sample can be obtained by transmitting electrons through it. In one embodiment, the sample 102 is extracted in the approximate shape of a cube having a characteristic dimension that is between about 20 nm and 200 nm.

The sample 102 is mounted on a thin needle 105 in such a way that the symmetry axis 120 of the needle 105 passes through any two diametrically opposed apexes of the cubic sample 102. The sample 102 can be attached to the thin needle 105 using conventional methods, such as conventional focused ion beam welding techniques. In focused ion beam welding, as described for example in U.S. Pat. No. 4,876,112 to Kaito et al. for a "Process for Forming Metallic Patterned Film" and U.S. Pat. No. 5,104,684 to Tao et al. for "Ion Beam Induced Deposition of Metals, the sample 102 and needle 105 are brought into close proximity near the focus of an ion beam. A suitable gas precursor, such as an organometallic gas, is introduced into the region defined by the sample 102, needle 105 and ion beam. The ion beam activates the gas precursor, either directly or indirectly (e.g., by heating the sample 102 or needle 105), and causes the precursor to dissociate into a volatile and a non-volatile component. The volatile component is removed by the FIB machine's vacuum system, while the non-volatile component deposits on the sample 102 and needle 105, thereby building a material bridge between and connecting the two.

Figure 2A:
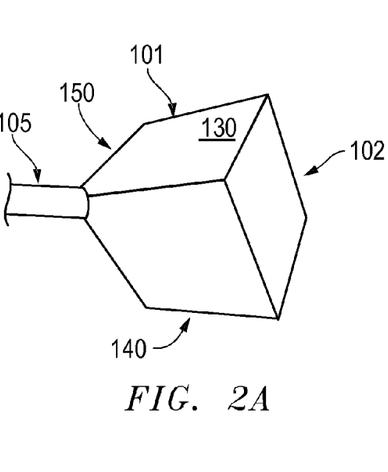
FIGS. 2A-2C show, in different rotational orientations, a sample having six faces, including three sets of orthogonal faces.
Figure 2B:
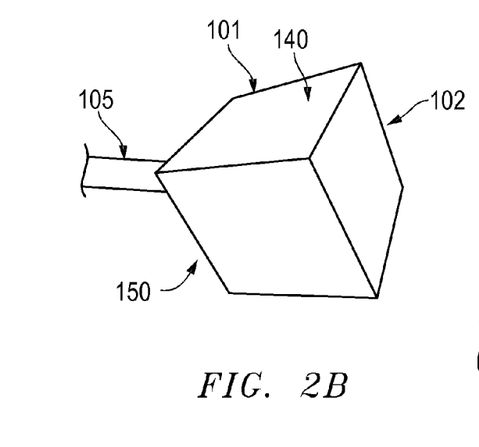
Figure 2C:
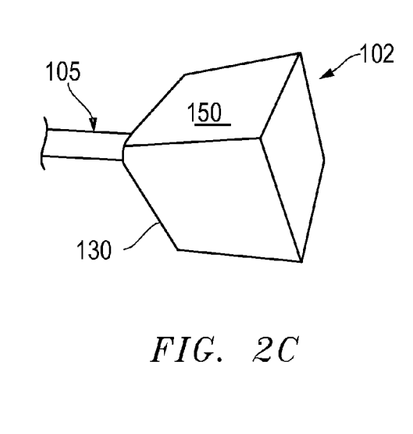

As shown in FIG. 2A, sample 102 has six faces, including three sets of orthogonal faces conveniently described by an initially top face 130, an initially front face 140 and an initially side face (currently obscured) 150. In an initial configuration, shown in FIG. 2A, an image of the sample 102 along a first orthogonal face 130 can be obtained by transmitting an electron beam 101 through the first orthogonal face 130. Next, the sample 102 is rotated through an angle of 120 degrees about the symmetry axes of needle 105 to which the sample 102 is attached. As shown in FIG. 2B, this rotation will expose a second orthogonal face 140 of sample 102 to the electron beam 101, allowing an image of sample 102 along the second orthogonal face 140 to be obtained. Finally, the sample 102 is rotated through an additional angle of 120 degrees about the symmetry axes of needle 105 to which sample 102 is attached. As shown in FIG. 2C, this rotation will expose a third orthogonal face 150 of sample 102 to the electron beam 101, allowing an image of sample 102 along the third orthogonal face 150 to be obtained.

Figure 3:
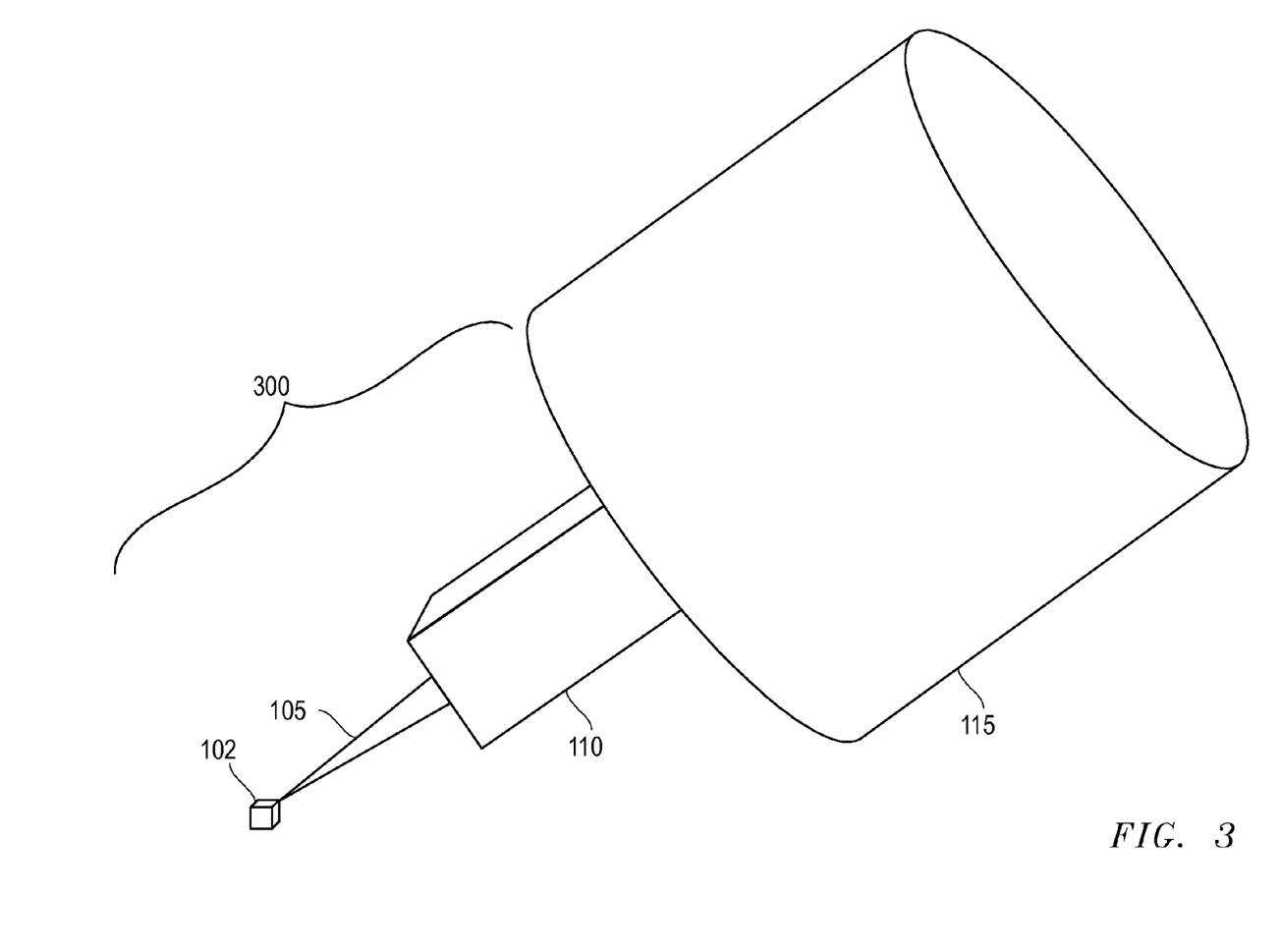
FIG. 3 is an illustration of one embodiment of mounting a sample on a sample holder.

FIG. 3 is an illustration of one embodiment of mounting a sample 102 on a sample holder 300. The sample holder 300 consists of a conventional tomography pin holder 115 that has had a thin lamella 110 attached to it and in turn a very fine needle 105 attached to the thin lamella 110. In one embodiment, the sample holder can be formed as follows. A thin lamella 110 having an approximate width of 500 nm, an approximate height of 5 microns and an approximate initial length of 15 microns can be made in a FIB machine using conventional FIB lamella manufacturing methods such as ion beam milling. Next, the top portion or approximately 5 microns of the length of the lamella can be milled to create a thin, conically shaped needle 105 having a tip with an approximately 30 nm radius. The needle 105 can be made, for example, using convention FIB annular milling techniques much like those used for the manufacture of tomography pillars or atom probe microscope samples. In annular milling, described for example in U.S. Pat. No. 7,442,924 to Giannuzzi et al for "Repetitive Circumferential Milling for Sample Preparation" in a FIB is used to etch a sequence of circular paths that are confined to an annulus having an inner and outer radius. The dwell time of the FIB along a given circular path is made dependent upon the radius of the path, so that the dwell time is longer for larger radial paths than for shorter radial paths. Since the amount of material removed by the FIB is a function of dwell time, more material is removed from larger radial paths than from smaller radial paths; and a conically shaped needle is thereby created. If the outer radius of the annulus is about 500 nm, the inner radius is about 30 nm, and the dwell time is chosen to mill approximately 3000 nm of material while traversing the 500 nm radial path and little to no material while traversing the 30 nm radial path, needle 105 can be made. Alternatively, needle 105 and lamella 110 can be separately made as described above and welded together using the FIB and a suitable gas precursor.

Once made or joined together, the lamella 110 and the needle 105 can be welded to the conventional manipulator needle or tomography pin holder 115 using conventional techniques. As explained above, the lamella 110 and tomography pin holder 115 can be welded together by bringing the two into close proximity in the presence of an ion beam and a suitable precursor such as an organometallic gas. In the presence of the ion beam, the precursor will dissociate into a volatile component that is removed by the FIB machine's vacuum system, and a non-volatile component that will deposit on the lamella 110 and/or the pin holder 115 to thereby build a bridge between and connect the two.

Figure 4:
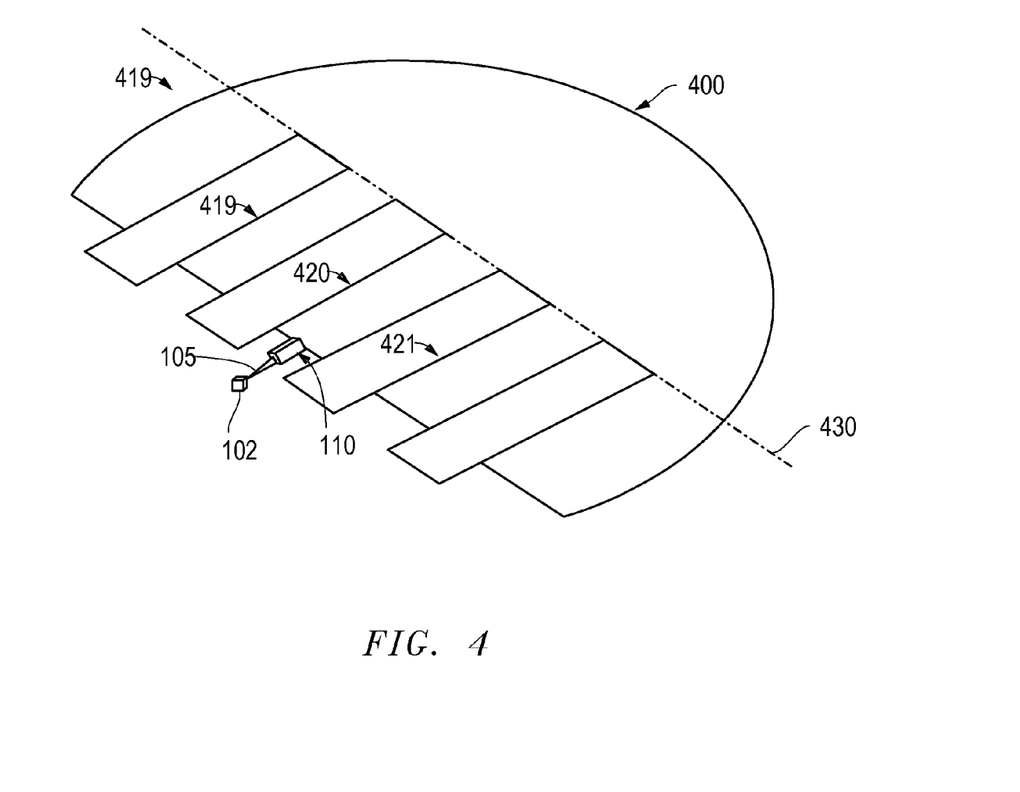
FIG. 4 is an illustration of a second embodiment of mounting a sample on a sample holder.

FIG. 4 is an illustration of a second embodiment of mounting a sample 102 on a sample holder 400. The sample holder 400 consists of a conventional copper TEM ½ grid with a 3 mm diameter with multiple mounting fingers 419-421, one of which 420 has a thin lamella 110 welded to it. A fine needle 105 is then attached to the lamella 110 in a similar fashion. The lamella 110 and needle 105 can be made as described above, i.e., as a single piece or as separate pieces welded together using conventional ion beam milling techniques. The sample 102 can then be FIB welded onto the tip of the needle.

Figure 5:
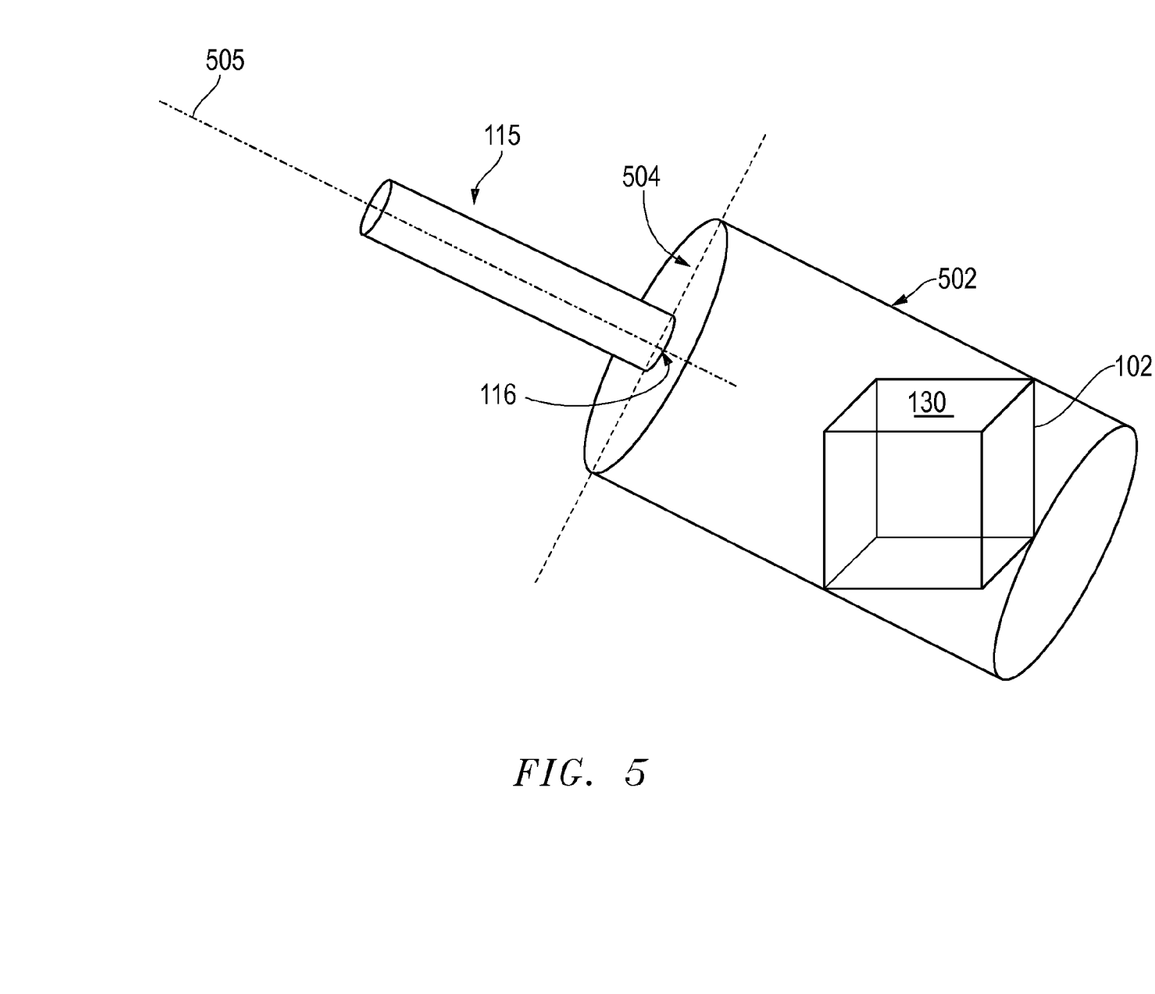
FIG. 5 is an illustration of an alternative embodiment for extracting and mounting a sample on a sample holder.

FIG. 5 is an illustration of an alternative embodiment for extracting and mounting a sample on a sample holder. As shown in FIG. 5, a sample 502 in the form of a short cylindrical column can be extracted from a larger piece of material using conventional TEM pillar sample preparation techniques, such as ion beam milling. The larger piece of material can have the region of interest 102 inside (defined here by the cube shape as an illustration to best show the orientation of the region of interest with respect to its orthogonal directions). The region of interest bounded by the 'virtual cube' determines the ultimate diameter and length of the cylinder. For example, the cylinder can be extracted from an integrated circuit, having as a region of interest 102 a feature or component such as a transistor.

The cylindrical column sample 502 can include the region of interest 102, and can be dimensioned so that its height, diameter and length allow appropriate encapsulation of the three orthogonal directions of the region of interest 102. The cylindrical column sample 502 can be extracted from the larger piece of material using methods similar to those used for conventional TEM pillar sample preparation techniques so that it has a principal axis 505 that passes through two diametrically opposed apexes of a virtual cube which encapsulates the region of interest 102. That is, the cylindrical column sample 502 can be extracted so that its principal axis 505 is vertically displaced from a top face 130 of the region of interest 102 by an angle of approximately 35.26 degrees, and is azimuthally displaced so that its projection onto the top face 130 of the region of interest 102 approximately bisects the top face 130 (i.e., is azimuthally displaced by an angle of about 45 degrees). As shown in FIG. 5, a cylindrical column sample 502 extracted in this way can be much more easily and accurately mounted onto a standard TEM tomography pin holder 115 using conventional FIB welding techniques since it has a flat face 504 that can be welded to the flat end 116 of the conventional pin holder 115.

Figure 6:
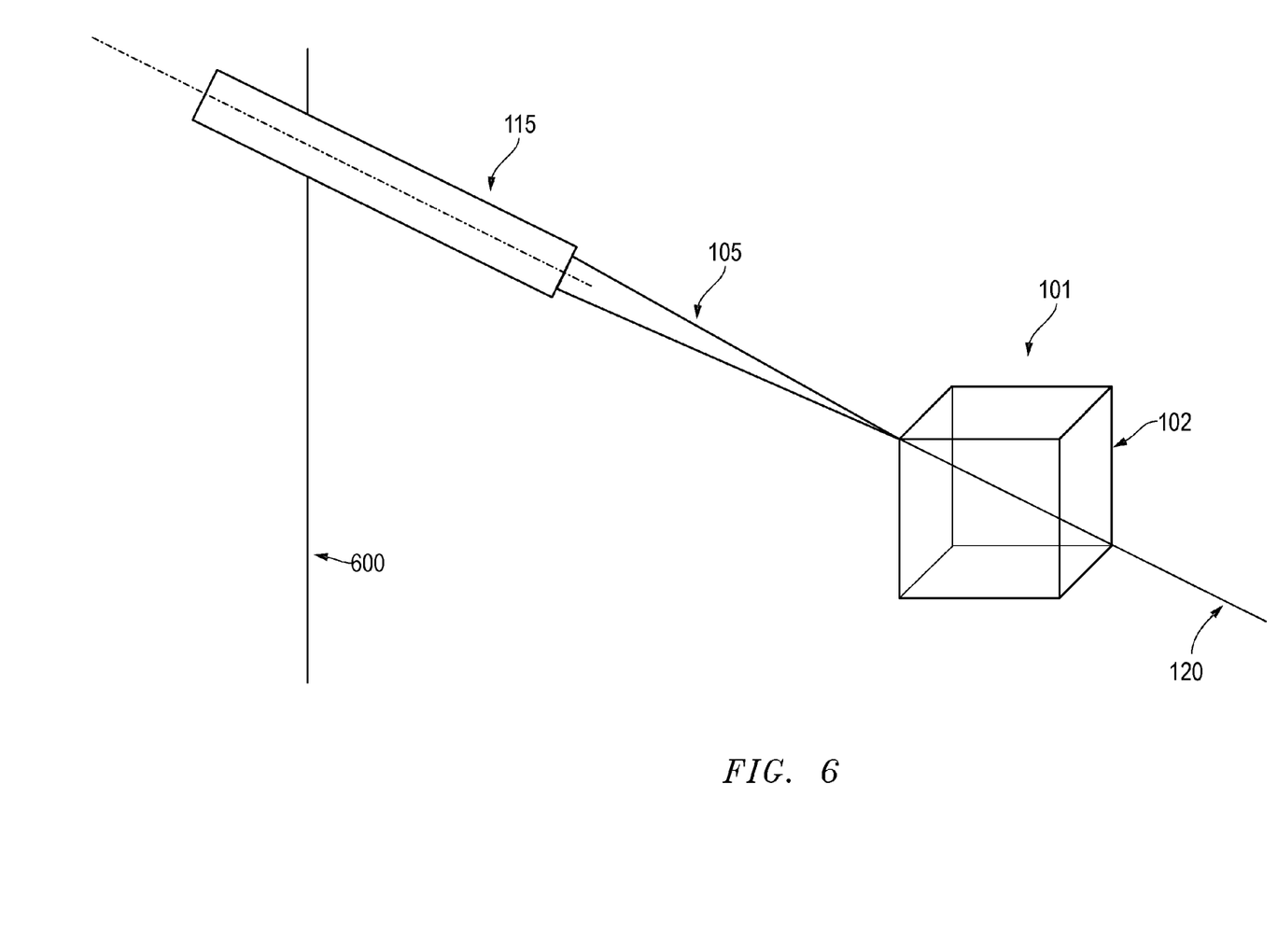
FIG. 6 is an illustration of an embodiment of mounting a sample on a pin holder at an angle inside the imaging area.

In some embodiments, as shown in FIG. 6, a sample 102 or a cylindrical column sample 502 (containing a region of interest 102) can be mounted on a conventional TEM tomography pin holder 115 or similar which is at an angle of approximately 35.62 degrees (from the horizontal) inside the TEM objective pole piece (imaging) area. In such embodiments, the sample 102/cylindrical column sample 502 can be easily rotated about symmetry axis 120 by simply rotating the manipulator or pin holder 115 using conventional TEM sample rotation techniques. As explained above, rotating sample 102/cylindrical column sample 502 in successive 120 degree increments exposes three orthogonal faces of sample (or region of interest) 102 to the electron beam 101, thereby allowing the TEM to capture three orthogonal images of the sample (or region of interest) 102.

Figure 7:
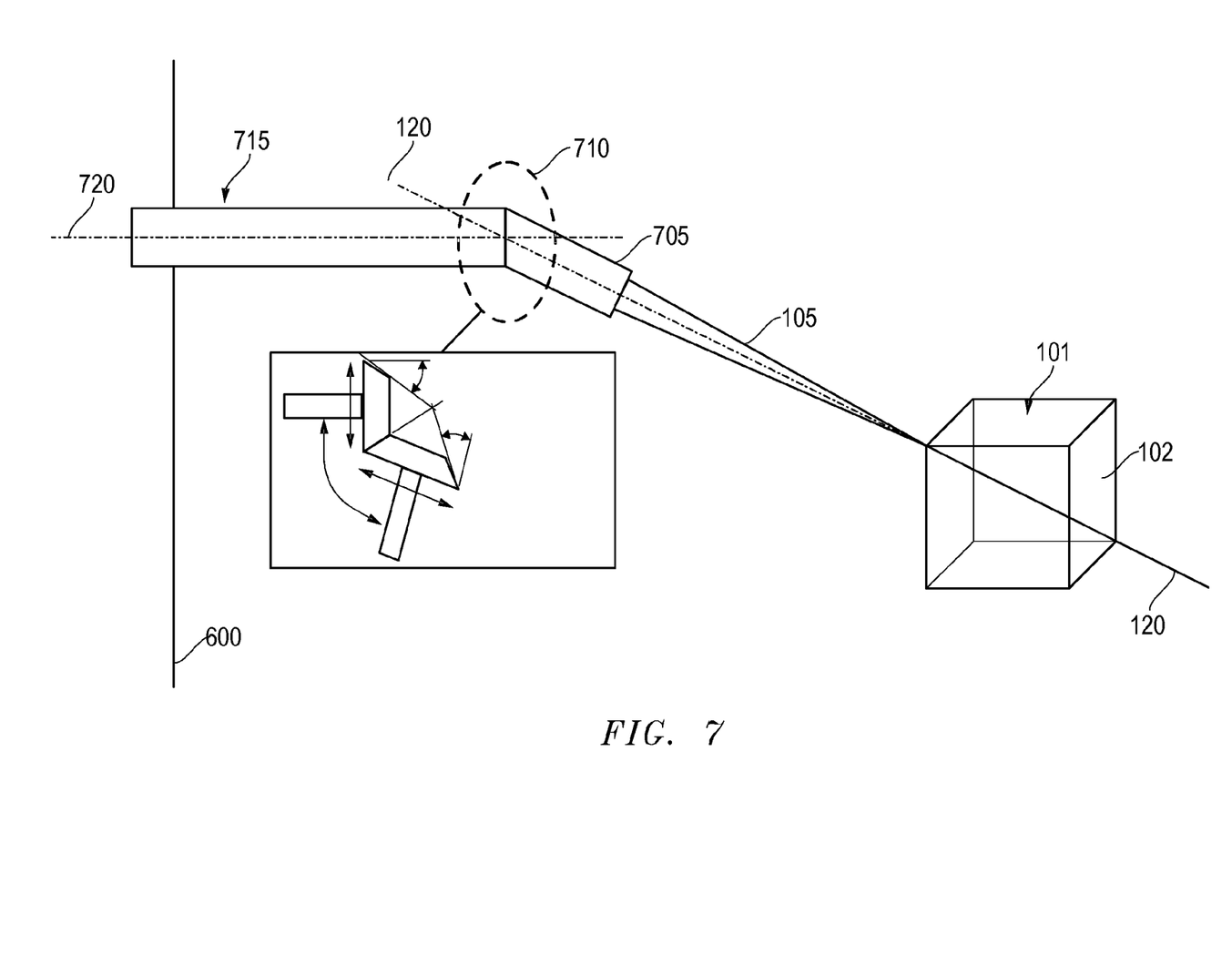
FIG. 7 is an illustration of an embodiment of mounting a sample on a manipulator that is rotationally coupled via a gear to an arm.

In other embodiments, as shown in FIG. 7, the sample 102 or cylindrical column sample 502 can be mounted on a manipulator 705 that is rotationally coupled via a gear 710 to an arm 715 that enters the side 600 of the TEM sample chamber at a right angle. When the arm 715 is rotated by successive 120 degree angles about its rotational axis 720, the gear 715 transfers the rotational motion from axis 720 to the rotational axis 120 of the manipulator 705 which passes through the diametrically opposed vertices of the sample (or region of interest) 102 as shown. Thus, gear 710 converts successive 120 degree rotations of arm 715 into successive 120 degree rotations about the rotational axis 120 of sample (or region of interest) 102, exposing three orthogonal faces of sample (or region of interest) 102 to the electron beam 101, thereby allowing the TEM to capture three orthogonal images of the sample (or region of interest) 102.

Figure 8A:
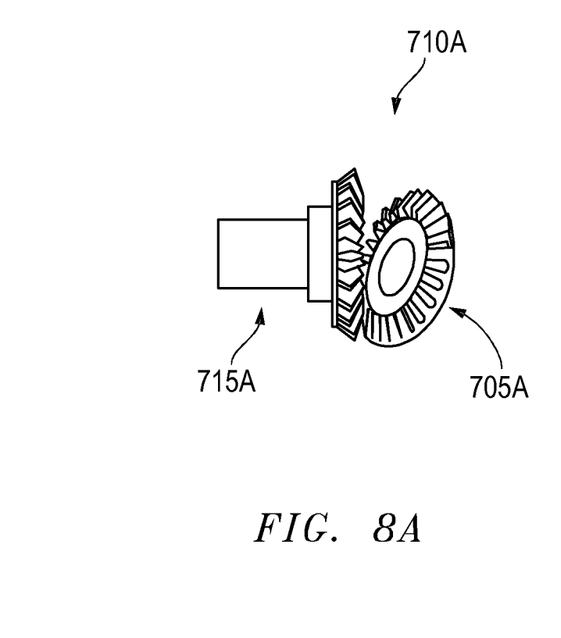
FIGS. 8A-8B are schematic illustrations of two types of gears that can be used in some embodiments of the invention.
Figure 8B:
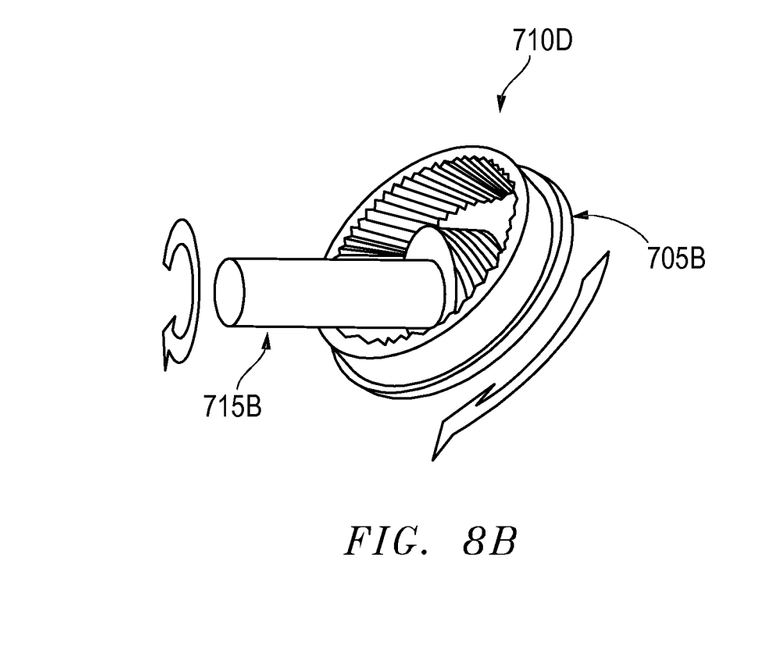

FIGS. 8A and 8B are schematic illustrations of just two types of gear that can be used to transfer rotational motion from a first axis to a second axis Skilled persons will be able to determine other such mechanisms. As shown in FIG. 8A, an angular bevel gear 710A can be used to transfer the rotational motion from arm 715/715A to manipulator 705/705A to which sample (or region of interest) 102 is attached. Alternatively, as shown in FIG. 8B, a crossed helical gear 710B can be used to transfer rotational motion from arm 715/715B to manipulator 705/705B to which sample (or region of interest) 102 is attached.

According to some embodiments of the invention, a method for obtaining orthogonal images of a sample in a charged particle beam apparatus, comprises connecting a sample having a plurality of orthogonal faces to a rotatable sample holder; rotating the rotatable sample holder to a plurality of angles, such that for each of the plurality of angles a different one of the sample's plurality of orthogonal faces is exposed to and normal to an electron beam generated by the charged particle beam apparatus; detecting, at each of the plurality of angles, the electrons from the electron beam that are transmitted through the sample plurality of orthogonal faces; and generating a plurality of images of the sample from the detected electrons transmitted through the sample at each of the plurality of angles.

In some embodiments, rotating the rotatable sample holder to a plurality of angles comprises rotating the rotatable sample holder to at least two angles selected from the group consisting of zero degrees, +/− hundred twenty degrees, and two hundred forty degrees. In some embodiments, connecting a sample having a plurality of orthogonal faces to a rotatable sample holder comprises connecting a cylindrical column containing a cubic region of interest having a plurality of orthogonal faces to the rotatable sample holder such that the axis of the cylindrical column passes through diametrically opposed apexes of the cubic region of interest. In some embodiments, connecting the cylindrical column to the rotatable sample holder comprises welding the cylindrical column to the rotatable sample holder.

In some embodiments, connecting a sample having a plurality of orthogonal faces to a rotatable sample holder comprises mounting a cubic sample on a needle such that the axis of the needle passes through diametrically opposed apexes of the cubic sample; and connecting the needle to the rotatable sample holder. In some embodiments, connecting the needle to the rotatable sample holder comprises welding the needle to the rotatable sample holder. In some embodiments, mounting the cubic sample on the needle further comprises making the needle in the charged particle beam apparatus via annular focused ion beam milling; making the cubic sample in the charged particle beam apparatus from a larger sample using a focused ion beam; welding the needle to the cubic sample so that the axis of the needle passes through the diametrically opposed apexes of the cubic sample; and separating the cubic sample, mounted onto the needle, from the larger sample.

In some embodiments, the rotatable sample holder passes through a wall in the charged particle beam apparatus at an oblique angle. In some embodiments, the rotatable sample holder is connected to a rotatable arm via a gear at an oblique angle, and the rotatable arm passes through a wall in the charged particle beam apparatus at a right angle. In some embodiments, rotating the rotatable sample holder to a plurality of angles comprises rotating the rotatable arm to a plurality of angles such that the rotation of the rotatable arm to the plurality of angles is transferred to the rotation of the rotatable sample holder to the plurality of angles by the gear. In some embodiments, the gear is at least one of an angular bevel gear or a crossed helical gear.

According to some embodiments of the present invention, a sample and sample holding apparatus for observing a sample in multiple directions using an electron beam in a transmission electron microscope, comprises a sample having at least three observation faces that are not parallel to each other, the thickness of the sample orthogonal to each of the observation faces being less than 200 nm; and a needle to which the sample is mounted, the needle rotatable about more than one axes so the needle can orient at least three of the observation faces to be normal to the electron beam of the electron microscope.

According to some embodiments of the present invention, a charged particle beam apparatus, comprises a charged particle beam source for illuminating a portion of the sample; at least one detector for detecting radiation emitted from the illuminated portion of the sample; a sample holder for holding the sample, the sample holder including a needle for attaching a sample, the needle rotatable about more than one axis so the needle can orient the sample so that at least three of the observation faces are normal to the electron beam of the electron microscope.

In some embodiments, the rotatable sample holder is rotatable to at least two angles selected from the group consisting of zero degrees, +/− hundred twenty degrees, and two hundred forty degrees. In some embodiments, the sample is welded to the rotatable sample holder. In some embodiments, the needle is welded to the rotatable sample holder. In some embodiments, the rotatable sample holder passes through a wall in the charged particle beam apparatus at an oblique angle.

In some embodiments, the rotatable sample holder is connected to a rotatable arm via a gear at an oblique angle, and the rotatable arm passes through a wall in the charged particle beam apparatus at a right angle. In some embodiments, the rotation of the rotatable arm to the plurality of angles is transferred to the rotation of the rotatable sample holder to the plurality of angles by the gear. In some embodiments, the gear is at least one of an angular bevel gear or a crossed helical gear.

Although much of the previous description is directed at features and components of IC devices, the invention could be used to visualize bulk samples of any suitable material. The terms "work piece," "sample," "substrate," and "specimen" are used interchangeably in this application unless otherwise indicated. Further, whenever the terms "automatic," "automated," or similar terms are used herein, those terms will be understood to include manual initiation of the automatic or automated process or step.

In the discussion and claims, the terms "including" and "comprising" are used in an open-ended fashion, and should be interpreted to mean "including, but not limited to . . . ."

To the extent that any term is not specially defined in this specification, the intent is that the term be given its plain and ordinary meaning. The accompanying drawings are intended to aid in understanding the present invention and, unless otherwise indicated, are not drawn to scale. Particle beam systems suitable for carrying out the present invention are commercially available, for example, from FEI Company, the assignee of the present application.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments described herein. As one of ordinary skill in the art will readily appreciate from the disclosure, processes, machines, manufacture, compositions of matter, means, methods, or steps, presently existing or later developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

I claim:

1. A method for obtaining orthogonal images of a sample in a charged particle beam apparatus, comprising:
   connecting a sample comprising three orthogonal faces that are not parallel to each other to a rotatable sample holder;
   rotating the rotatable sample holder to a plurality of angles, such that for each of the plurality of angles a different one of the three orthogonal faces is exposed to and normal to an electron beam generated by the charged particle beam apparatus;
   detecting, at each of the plurality of angles, the electrons from the electron beam that are transmitted through each of the three orthogonal faces; and
   generating three orthogonal images of the sample from the detected electrons transmitted through the sample at each of the three orthogonal faces.

2. The method of claim 1, wherein rotating the rotatable sample holder to a plurality of angles comprises rotating the rotatable sample holder to at least two angles selected from the group consisting of zero degrees, +/− hundred twenty degrees, and two hundred forty degrees.

3. The method of claim 1, wherein connecting a sample comprising three orthogonal faces that are not parallel to each other to a rotatable sample holder comprises connecting a cylindrical column containing a cubic region of interest, the cubic region of interest comprising the three orthogonal faces to the rotatable sample holder such that the axis of the cylindrical column passes through diametrically opposed apexes of the cubic region of interest.

4. The method of claim 3, wherein connecting the cylindrical column to the rotatable sample holder comprises welding the cylindrical column to the rotatable sample holder.

5. The method of claim 1, wherein connecting a sample comprising three orthogonal faces that are not parallel to each other to a rotatable sample holder comprises:
   mounting a cubic sample on a needle such that the axis of the needle passes through diametrically opposed apexes of the cubic sample; and
   connecting the needle to the rotatable sample holder.

6. The method of claim 5, wherein connecting the needle to the rotatable sample holder comprises welding the needle to the rotatable sample holder.

7. The method of claim 5, wherein mounting the cubic sample on the needle further comprises:
making the needle in the charged particle beam apparatus via annular focused ion beam milling;
making the cubic sample in the charged particle beam apparatus from a larger sample using a focused ion beam;
welding the needle to the cubic sample so that the axis of the needle passes through the diametrically opposed apexes of the cubic sample; and
separating the cubic sample, mounted onto the needle, from the larger sample.

8. The method of claim 1, wherein the rotatable sample holder passes through a wall in the charged particle beam apparatus at an oblique angle.

9. The method of claim 1, wherein the rotatable sample holder is connected to a rotatable arm via a gear at an oblique angle, and the rotatable arm passes through a wall in the charged particle beam apparatus at a right angle.

10. The method of claim 9, wherein rotating the rotatable sample holder to a plurality of angles comprises rotating the rotatable arm to a plurality of angles such that the rotation of the rotatable arm to the plurality of angles is transferred to the rotation of the rotatable sample holder to the plurality of angles by the gear.

11. The method of claim 9, wherein the gear is at least one of an angular bevel gear or a crossed helical gear.

12. The method of claim 1, wherein:
the sample is a cubic sample; and
the cubic sample is mounted on a needle connected to the rotatable sample holder such that the axis of the needle passes through diametrically opposed apexes of the cubic sample.

13. A sample assembly for a transmission electron microscope in which multidirectional observations are made with an electron beam, comprising:
a sample having at least three observation faces that are not parallel to each other, the thickness of the sample orthogonal to each of the observation faces being less than 200 nm; and
a sample holding apparatus comprising a needle to which the sample is mounted, the needle rotatable about more than one axis so the needle can orient at least three of the observation faces to be normal to an electron beam of a transmission electron microscope.

14. A charged particle beam apparatus, comprising:
an electron microscope comprising an electron beam source for transmitting an electron beam through a sample having at least three observation faces that are not parallel to each other;
a sample holder for holding the sample, the sample holder including a needle for attaching the sample, the needle rotatable about more than one axis and capable of orienting each of the at least three observation faces normal to the electron beam of the electron microscope while the needle is attached to the sample; and
at least one detector configured to detect electrons of the electron beam transmitted through and emitted from the sample at each orientation of the sample in which the electron beam is normal to one of the at least three observation faces.

15. The charged particle beam apparatus of claim 14, wherein the needle is rotatable to at least two angles selected from the group consisting of zero degrees, +/− hundred twenty degrees, and two hundred forty degrees.

16. The charged particle beam apparatus of claim 14, wherein the sample is welded to the needle.

17. The charged particle beam apparatus of claim 14, wherein:
the sample holder comprises a rotatable shaft; and
the needle is welded to the rotatable shaft and rotation of the rotatable shaft rotates the needle.

18. The charged particle beam apparatus of claim 14, wherein the sample holder passes through a wall in the charged particle beam apparatus at an oblique angle.

19. The charged particle beam apparatus of claim 14, wherein the sample holder is connected to a rotatable arm at an oblique angle via a gear, and the rotatable arm passes through a wall in the charged particle beam apparatus at a right angle.

20. The charged particle beam apparatus of claim 19, wherein the rotatable arm, the rotatable gear, and the rotatable sample holder are configured such that:
rotation of the rotatable arm about a first axis of rotation causes the gear to rotate the rotatable sample holder about a second axis of rotation different from the first axis of rotation;
the rotatable sample holder can be rotated to a plurality of angles by rotating the rotatable arm; and
for each of the plurality of angles a different one of the at least three observation faces is exposed to and normal to the electron beam.

21. The charged particle beam apparatus of claim 19, wherein the gear is at least one of an angular bevel gear or a crossed helical gear.

22. The method of claim 1, wherein the surface of the sample consists of three orthogonal faces that are not parallel to each other.

* * * * *